United States Patent [19]
Kurihara et al.

[11] Patent Number: 4,935,897
[45] Date of Patent: Jun. 19, 1990

[54] SEMICONDUCTOR MEMORY DEVICE SUITABLE FOR USE AS A DOT IMAGE BUFFER FOR A PRINTER

[75] Inventors: Ryoichi Kurihara; Takashi Tabei, both of Hadano, Japan

[73] Assignee: Hitachi, Ltd., Tokyo, Japan

[21] Appl. No.: 272,397

[22] Filed: Nov. 17, 1988

[30] Foreign Application Priority Data

Nov. 21, 1987 [JP] Japan ................... 62-294706

[51] Int. Cl.$^5$ ............................................. G11C 13/00
[52] U.S. Cl. ........................... 365/189.05; 365/230.08
[58] Field of Search ............ 365/189.05, 189.12, 365/230.03, 230.05, 230.06, 230.08, 230.09, 232, 240

[56] References Cited

U.S. PATENT DOCUMENTS

| | | | |
|---|---|---|---|
| 4,608,671 | 8/1986 | Shimizu et al. | 365/230.03 |
| 4,611,299 | 9/1986 | Hori et al. | 365/230.03 |
| 4,630,230 | 12/1986 | Sundet | 365/230.03 |
| 4,752,915 | 1/1988 | Suzuki et al. | 365/230.03 |
| 4,791,607 | 12/1988 | Igarashi et al. | 365/230.08 |

*Primary Examiner*—Terrell W. Fears
*Attorney, Agent, or Firm*—Fay, Sharpe, Beall, Fagan, Minnich & McKee

[57] ABSTRACT

A rowwise line of a memory cell array in a semiconductor memory storing a dot image is selected with the aid of a part of an address signal. Data of the selected one rowwise line is considered to be represented in the form of a data matrix array including a plurality of rows and a plurality of columns. One row or one column of the matrix array is designated by the remaining part of the address signal. Dot image data rotated by 90°, 180° or 270° relative to the stored image data can be successively read out with the address signal undergoing no more than a regular change.

11 Claims, 5 Drawing Sheets

| M1 | M2 | M3 | M4 |
| --- | --- | --- | --- |
| M5 | M6 | M7 | M8 |
| M9 | M10 | M11 | M12 |

SEMICONDUCTOR MEMORY DEVICE SUITABLE FOR USE AS A DOT IMAGE BUFFER FOR A PRINTER

BACKGROUND OF THE INVENTION

The present invention generally relates to a semiconductor memory and more particularly to a semiconductor memory which is suited for use as a dot image buffer for a printer.

In general, a high-speed printer is equipped with a dot image buffer of a capacity corresponding to at least one sheet of printing paper. In the dot image buffer, dot image data such as character font, graphic data or the like are written word by word (with one word usually consisting of 32 or 16 bits). upon completion of writing data for one sheet of printing paper, the data are read out also on the word-by-word basis from the dot image buffer to be printed on the printing sheet.

At this juncture, functions required for the dot image buffer will be considered. When the image data written in the dot image buffer are to be printed as they are, the data may be read out in the same address order or sequence as they were written. However, when the image is to be printed with a rotation of 90°, the image data rotated by 90° have to be read out on the word basis. Besides, in the case of printing on both surfaces of printing paper, function of rotating the image by 180° is required because the printing is first performed on the front surface of printing paper, being followed by the printing on the rear surface after turning the printing paper over. Furthermore, capability of rotating the image by 270° may become necessary, as occasion requires.

A typical prior art LSI destined to be used for a printer controller having the functions mentioned above is disclosed, for example, in an article entitled "LSI For Low/Intermediate Speed Printer Controller Scheduled For Sale" contained in a Japanese Periodical "Nikkei Electronics", No. 429, (Sept. 7, 1987), pp. 80–81. This known LSI destined for the printer controller is a memory of small capacity having a bit array of 64×64 bits and so implemented that character fonts (consisting of 16×16 bits) are read successively from a character font memory word by word (i.e. on the 16 bit basis) into an internal memory array, being then followed by rotation of 90° and subsequent readout of the word on a 16 bit basis. Now, suppose that the image data in a dot image buffer of a large capacity is rotated with the aid of the LSI of the special type mentioned above by an angle equal to a multiple of 90°. In that case, the LSI of the special type has to be connected at a stage preceding the dot image buffer. The image data read out after rotation are written in the dot image buffer successively on the word by word basis in the manner mentioned above. Upon completion of the writing operation for one character font, the similar processing is repeated for another character font. In this way, character data for one sheet of printing paper can be prepared by executing repeatedly the procedure outlined above.

As the input data for the printer, there can be graphic data, compressed data transmitted from facsimile equipment and others in addition to the character data mentioned above. These graphic data and the compressed data cannot satisfactorily be dealt with through rotation of the fragmentary image data at the stage preceding the dot image buffer in such a manner as disclosed in the abovementioned literature.

In the case of the compressed data, the dot image data can not be definitely determined until expansion of the data for one lateral row or one page has been completed, although it depends on the type of data compression which the data has undergone. Also in the case of the compressed data, the expanded dot image data have to be written sequentially in the dot image buffer. In this conjunction, the dot image buffer is generally required to have a memory capacity of about 2 M bytes for a sheet of printing paper of A3 size and ordinarily has a double memory capacity. For this reason, the dot image buffer is usually constituted by a MOS RAM of a large capacity. For this reason, the dot image buffer has not heretofore been imparted with the rotational readout function. If the LSI disclosed in the literature cited above is to be employed in combination with the dot image buffer of large capacity, the former must be provided in the stage succeeding the latter. In that case, however, the data can be read out only at a low speed because in order to print out the compressed data mentioned above by rotating it on the 90° basis, it is necessary to read out word by word the image data from a given rectangular area of the dot image buffer and write the data in the destined LSI, which operation must be repeated by rotating the image in the dot image buffer by 90°.

SUMMARY OF THE INVENTION

It is therefore an object of the present invention to provide a semiconductor memory of a large capacity in which reading of image data through rotations by multiples of 90° can be easily realized.

In view of the above object, there is provided according to a general aspect of the invention a semiconductor memory which comprises a memory cell array having columnwise lines and rowwise lines arrayed in a matrix-like configuration, means for dividing data of one selected rowwise line of the memory cell array into a plurality of data groups and selecting one data group from the plurality of data groups, and means for selecting simultaneously one bit from every one of said plural data groups.

With the structure of the semiconductor memory taught by the present invention, it is possible to make data bits of one selected rowwise line of the memory cell appear logically in a matrix-like form. In this conjunction, the division of data for ore selected rowwise line of the memory cell array into the plurality of data groups and sequential selection of the data group one by one from the plurality of data groups corresponds to the successive data reading in the horizontal or lateral direction (i.e. at the rotation angle of 0°), while the simultaneous selection of one bit from every one of the plural data groups corresponds to the data reading in the vertical direction (i.e. at the rotational angle of 90°). Thus, the rotational read operation can be performed without any need for modification of the conventional memory configuration employed commonly in the prior art.

DESCRIPTION OF THE PREFERRED EMBODIMENTS

Now, the invention will be described in detail in conjunction with illustrative embodiments thereof.

Figure 1:
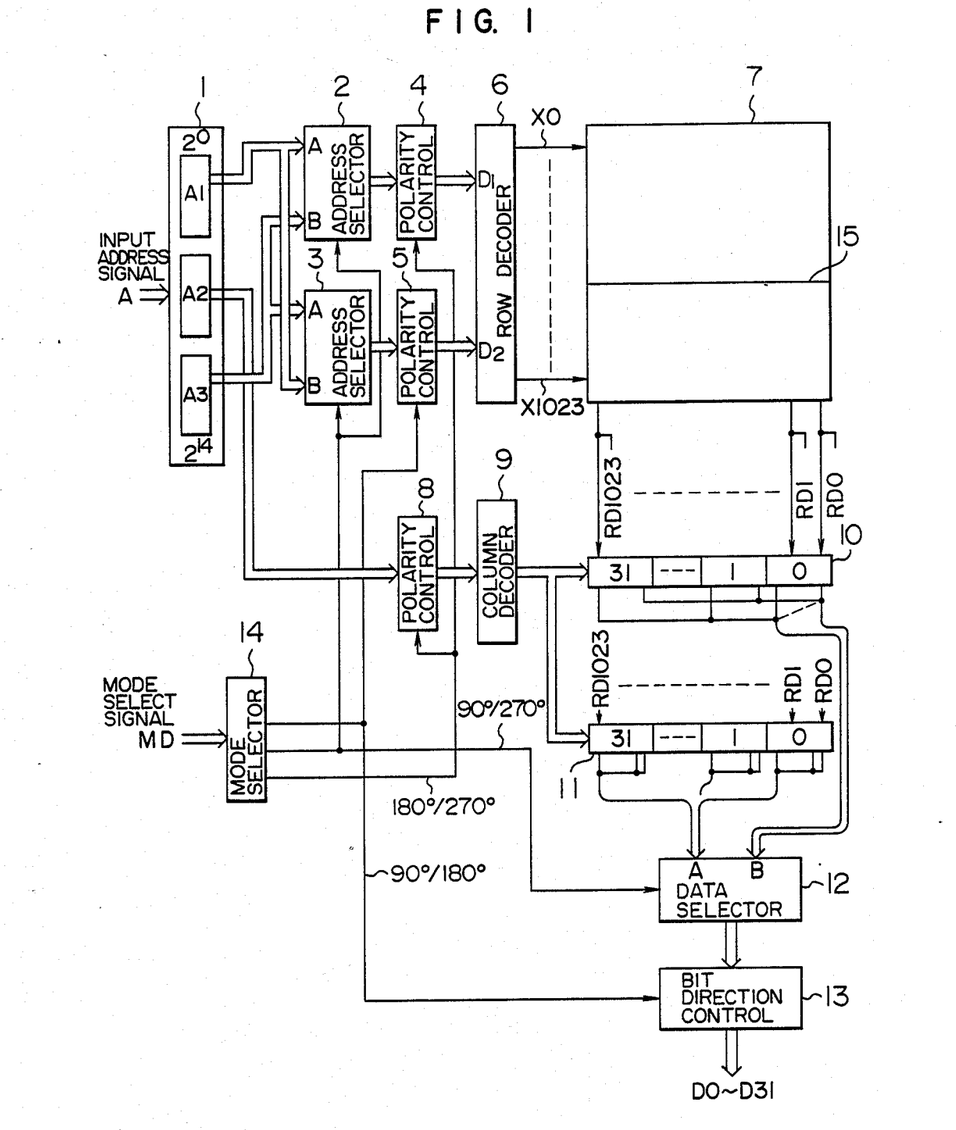
FIG. 1 is a block diagram showing a general arrangement of a semiconductor memory according to an exemplary embodiment of the invention.

FIG. 1 shows in a block diagram a structure of a semiconductor memory according to an embodiment of the invention. Referring to the figure, a memory cell array 7 of 1 Mbits consists of 1024 rowwise lines 15 each of 1024 bits, wherein an input address signal A is of 15 bits.

An address buffer 1 receives the address signal A as the input thereto and divides the bits of the address signal A inclusive of the least significant bit ($2^0$) to the most significant bit ($2^{14}$) into three signal or address groups each of 5 bits to ba outputted from the buffer. The least significant address group A1 (consisting of bits $2^0$ to $2^4$) is supplied to an input terminal A of an address selector circuit 2 and an input terminal B of an address selector circuit 3. The medially significant (or median significance) address group A2 (consisting of bits $2^5$ to $2^9$) is supplied to the input terminal of a polarity control circuit 8 whose output is supplied to the input of a column decoder 9. The most significant address group A3 (consisting of bits $2^{10}$ to $2^{14}$) is supplied to the input terminal B of the address selector circuit 2 and to the input terminal A of the address selector circuit 3. The output of the address selector circuit 2 is inputted to a polarity control circuit 4 whose output is applied to the least significant address input terminal D1 of a row decoder 6. Similarly, the output of the address selector circuit 3 is applied to the input of a polarity control circuit 5 whose output in turn is applied to the most significant address input terminal D2 of the row decoder 6.

The row decoder 6 decodes the address signals applied, respectively, to the least significant address input terminal D1 and the most significant address input terminal D2 to thereby select one rowwise line (designated by 15 in FIG. 1) from 1024 rowwise lines of the memory cell array 7. Data RD0, ..., RD1023, of the selected one rowwise line read out from the memory cell array 7 are inputted to data selectors 10 and 11, respectively. More specifically, the data selector 10 divides the input data RD0, ..., RD1023 into 32 data groups each consisting of 32 successive or serial bits to thereby output the data of one data group which is selected by the output of the column decoder 9. On the other hand, the data selector 11 outputs data of one data group consisting of 32 bits each selected from each of the abovementioned 32 data groups, respectively, by the output of the column decoder 9. The output of the data selector 10 is applied to an input terminal B of a data selector circuit 12, while that of the data selector 11 is applied to an input terminal A of the data selector circuit 12. The output signal of the data selector circuit 12 is inputted to a bit direction control circuit 13 which serves to rearrange the weights of 32 bits of the input data. More specifically, the bit direction control circuit 13 controls the direction of the bit sequence such that the data bits D0, ..., D31 are to be outputted simultaneously in this order or rearranged in the reverse sequence D31, ..., D0 before being outputted.

A mode selector circuit 14 has an input supplied with a mode select signal MD commanding an angle of rotation and produces as the output thereof angular signals 90°/180°, 90°/270° or 180,/270°. The angular signal 90°/180° is validated when rotation of 90° or 180° is commanded and applied to the polarity control circuit 5 and the bit direction control circuit 13. On the other hand, the angular signal 90°/270° is supplied to the address selector circuits 2 and 3 and the data selector circuit 12, respectively, while the angular signal 180°/270° is supplied to the polarity control circuits 4 and 8, respectively. The address selector circuits 2 and 3 and the data selector circuit 12 select the signals applied to the respective input terminals A to be outputted unless the applied angular signal is activated, while selecting the signals applied to the input terminals B as the respective outputs when the angular signal as applied is activated. The polarity control circuits 4, 5 and 8 output the respective input signals intact as they are unless the associated angular signal is activated while inverting the polarity of the respective input signals before outputting when the angular signal is activated. Similarly, the bit direction control circuit 13 outputs the input data in the same direction as they were inputted unless the angular signal is activated while rearranging or reversing the direction of the input data before outputting when the angular signal is activated.

Figure 3:
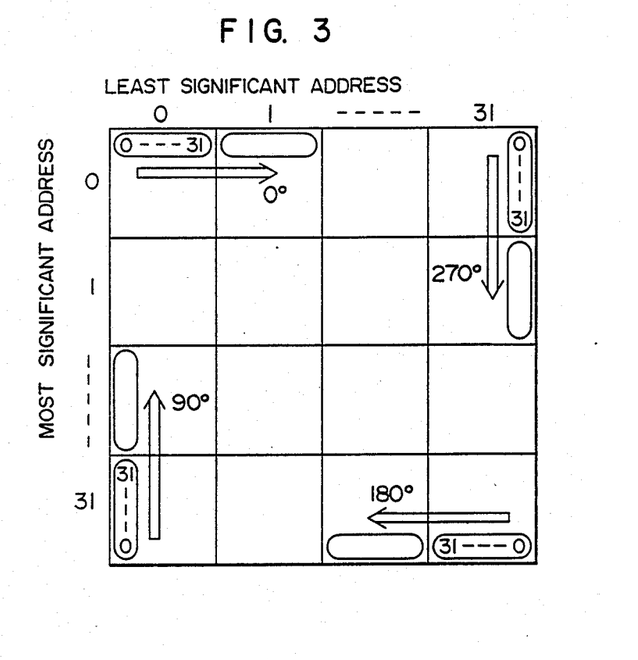
FIG. 3 is a matrix diagram for illustrating operation of the semiconductor memory shown in FIG. 1.
Figure 4:
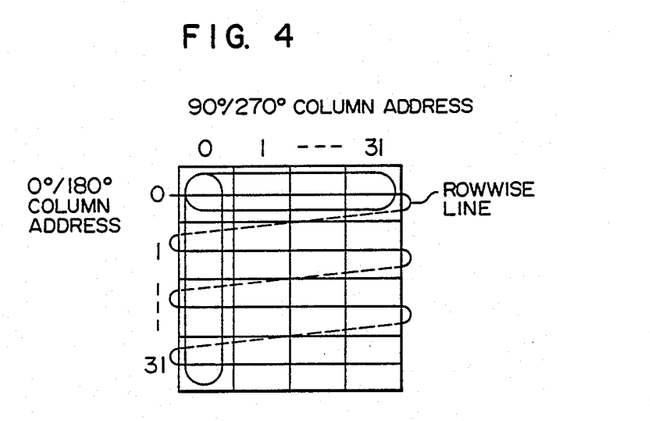
FIG. 4 is a view showing in more detail the matrix shown in FIG. 3.

Next, description will be directed to the rotational read operation of the semiconductor memory by also referring to FIGS. 3 and 4.

In FIG. 3, 1024 rowwise lines of the memory cell 7 shown in FIG. 1 are logically represented by a matrix of 32×32 blocks each of 32×32 bits. The rowwise direction in the matrix shown in FIG. 3 is selected by the address signal of 5 bits applied to the least significant address input terminal D1 of the row decoder 6, while the columnwise direction is selected by the address signal of 5 bits applied to the most significant address input terminal D2 of the row decoder 6, whereby the rowwise line located at the intersection of the selected row and column is activated. Accordingly, each block consisting of 1024 bits (=32×32 bits) is equivalent to a single physical rowwise line (e.g. the line designated by 15 in FIG. 1), wherein the one rowwise line in each block can be represented by a matrix of 32×32 bits, as is illustrated in FIG. 4. Further, there is illustrated in FIG. 3 the read address directions and weights of the 32-bit data as read out in correspondence with the rotation of 0°, 90°, 180° and 270°, respectively.

In the first place, a reading operation of image data in the dot image buffer will be described when the angular signal is 0°, i.e. when no rotation is performed for the image within the dot image buffer.

Referring to FIG. 3, when the image within the dot image buffer is not rotated, it is required to select the least significant row addresses sequentially for the rowwise line. Accordingly, the least significant address group A1 is selected for the lease significant address input terminal D1 of the row decoder 6 shown in FIG. 1 by the address selector circuit 2 without undergoing the polarity inversion through the polarity control circuit 4. When the least significant row address has attained the uppermost right block 31 of the matrix shown in FIG. 3, it is then necessary to reset the least significant row address to "0" and increment the 0°/180° row address from "0" to "1". To this end, the median significance address group A2 of the address buffer 1 is applied to the column decoder 9 without undergoing polarity inversion through the polarity control circuit 8. At that time, the carry operation for the least significant row address is preferably effective to increment the column address by one.

At this juncture, a flow of data read out for one selected rowwise line will be elucidated. Referring to FIG. 4, one rowwise line is represented in the form of a matrix. When the rotational angular signal is 0°, it is necessary to read out simultaneously 32 bits of one row designated by the 0°/180° column address among the rows 0, 1, . . . , 31. For this purpose, one of 32 data groups each consisting of 32 successive bits is selected by the data selector 10 under command of the output signal from the data selector 9 to be subsequently applied to the input terminal A of the data selector circuit 12. In this manner, 32 bits of one row shown in FIG. 4 have been selected. Since the angular signal 90°/270° is not validated in the data selector circuit 12, the data applied to the input terminal A thereof is selected to be outputted intact in the order of D0, . . . , D31 without undergoing a reversion of the bit order in the succeeding bit direction control circuit 13.

Turning back to FIG. 3, it is assumed that the selected address has further been incremented. More specifically, when the selected address has attained the state in which the most significant row address is "0", the least significant row address is "31" and the 0°/180° column address shown in FIG. 4 is "31", the least significant address group A1 and the median significance address group A2 in the address buffer 1 assume the respective maximum values. When the selected address is then incremented by one, the most significant address group A3 assumes "1", while both the least significant address group A1 and the median significance address group A2 assume "0", whereby the most significant address shown in FIG. 3 shifts from "0" to "1". In the similar manner, incrementation of the selected address is subsequently performed starting from the least significant row address.

From the foregoing description, it can be appreciated that the external address signal A can regularly be incremented independently of the internal structure such as row and column selecting schema and others.

Next, description is directed to the read operation when the image within the dot image buffer is rotated by 90°.

In this case, the reading operation is started from the left bottom end of the matrix shown in FIG. 3 where the least significant row address is "0", the most significant row address is "31" and the 90°/270° column address is "0", as is shown in FIG. 3. At that time, the external address signal A assumes the minimum value, i.e. "0", the mode select signal MD designates 90°. The angular signals 90°/180° and 90°/270° outputted from the mode select circuit 14 are validated. The least significant address group A1 of the address buffer 1 is selected by the address selector circuit 3 to be outputted and subsequently undergo polarity inversion through the polarity control circuit 5 to be applied to the most significant address input terminal D2 of the row address decoder 6. The median significance address group A2 is applied to the column decoder 9 with the polarity as it is, as in the case of the image rotation by 0°. The most significant address group A3 is selected by the address selector circuit 2 to be outputted and applied to the least significant address input terminal D1 of the row decoder 6 with the polarity as it is. Thus, the external address signal A can regularly be incremented, while the address selection proceeds in the direction labelled "90" in FIG. 3 within the semiconductor memory.

In the subsequent data read operation, the whole one column of 32 bits designated by the 90°/270° column address has to be read out simultaneously, as shown in FIG. 4. To this end, 32 bits in total each selected by the column decoder 9 from each of the 32 data groups placed in the data selector 11 shown in FIG. 1 are applied to the input terminal B of the data selector circuit 12. In this manner, 32 bits of one column shown in FIG. 4 have been selected. Since the angular signal 90°/270° is validated for the data selector circuit 12, the data at the input terminal B is selected to be outputted. Subsequently, the bit direction is reversed by the bit direction control circuit 13 to be outputted.

Next, description will be made of the reading operation performed when the image within the dot image buffer is rotated by 180°. In this case, the start point for the reading operation lies at the bottom rightmost location or at the most significant address, as is illustrated in FIG. 3. Moreover, the data bit direction has to be reversed relative to the bit direction in the case of a reading operation at the rotational angle of 0°. As will be readily appreciated in conjunction with the internal address selection, the address direction corresponding to the rotational read angle of 180° can be realized by inverting the polarity of the addresses in the case of the reading operation at the rotational angle of 0°, i.e. by inverting the polarity of all of the least significant row address, most significant row address and the column address. Similarly, for the data read out, the data of 32 bits selected by the data selector 10 as in the case of the reading operation at the rotational angle of 0° are reversed in respect to the bit direction by means of the bit direction control circuit 13.

Finally, the reading operation at the rotational angle of 270° can basically be carried out by following reversely the procedure described hereinbefore in connection with the reading operation at the rotational angle of 90°, as will be readily appreciated from the foregoing description and illustration in FIG. 3.

Figure 7:
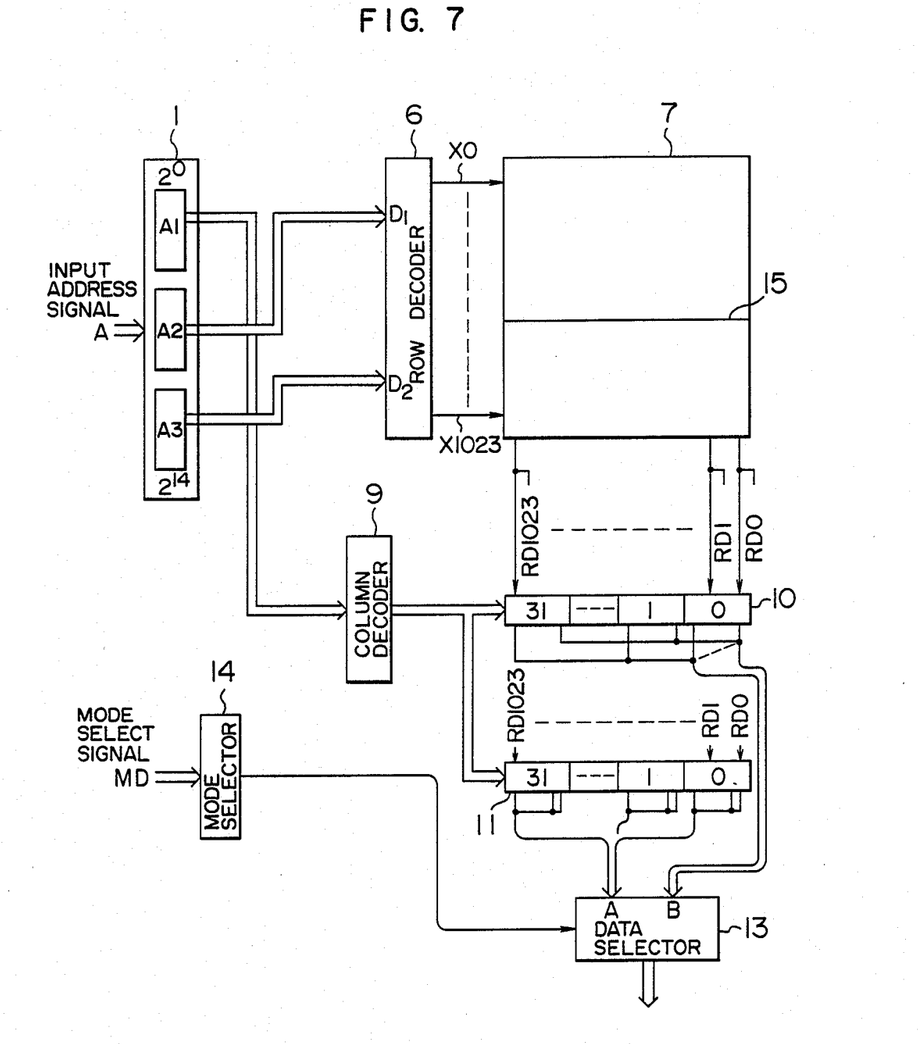
FIG. 7 is a block diagram showing, by way of example, a structure of a character generator in which the teaching of the invention can be incarnated for both of raster scan and column scan.

According to the embodiment shown in FIG. 1, a reading operation of the semiconductor memory of large capacity employed conventionally can be realized by rotating the image data on the 90° basis, wherein the address signal supplied eternally can regularly be incremented independent of any rotational angle. In the foregoing description made with reference to FIG. 1, it has been assumed, by way of example only, that the data stored fixedly in a read-only memory (ROM) are to be read out. As an example of application of such a ROM, there is a character generator. In this conjunction, it is preferred that the character generator to which the present invention is to be applied should be implemented in such a structure as shown in FIG. 7. More specifically, referring to FIG. 7 in which the same or equivalent parts and items as those shown in FIG. 1 are designated by like reference numerals and symbols, the character generator shown in FIG. 7 is intended for constituting one character with 32×32 bits. The median significance address group and the most significant address group of the input address signal may preferably be utilized for decoding the rowwise line of the dot image buffer with the least significant address group being supplied to the column decoder 9. With this arrangement, there can be obtained a character generator capable of performing both raster scan and column scan by changing over correspondingly the mode select signal.

Figure 2:
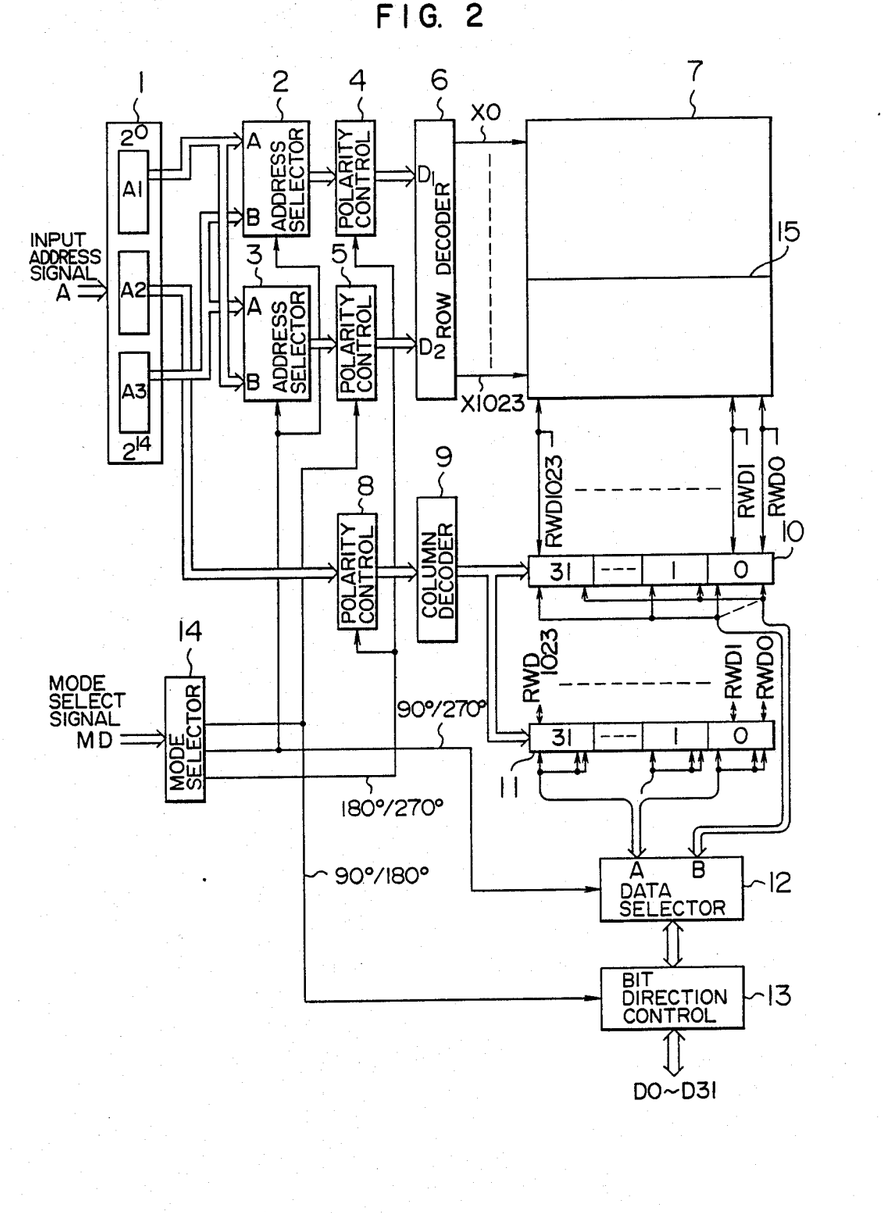
FIG. 2 is a block diagram showing an arrangement of the semiconductor memory according to another embodiment of the invention.

FIG. 2 is a block diagram showing another embodiment of the semiconductor memory according to the invention. In FIG. 2, parts and items that are the same or equivalent to those shown in FIG. 1 are denoted by like reference numerals and symbols. Difference in the structure of the semiconductor memory shown in FIG. 2 from that of FIG. 1 is seen in that data D0, ..., D31 are bidirectional to the memory cell array 7, i.e., these data can be written and read in and from the memory cell array 7. Correspondingly, the bit direction control circuit 13, the data selector circuit 12 and the data selectors 10 and 11 are, respectively, so implemented as to be capable of bidirectional data transfer.

By virtue of the arrangement shown in FIG. 2, the image rotation function on the 90° basis can be made of in the dot image data writing operation as well, whereby writing of vertical lines such as, for example, rules of a table can be realized at an increased speed.

Figure 5:
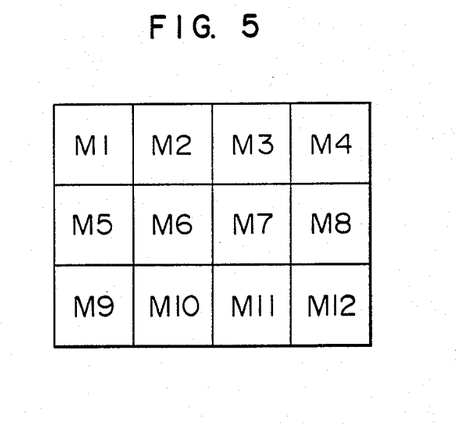
FIG. 5 is a schematic diagram showing a structure of a dot image buffer implemented by using the semiconductor memories taught by the invention.

FIG. 5 shows an exemplary embodiment of the dot image buffer implemented by using a number of the semiconductor memories according to the present invention. In FIG. 5, reference symbols M1, M2, ..., M12 designate the semiconductor memories each implemented according to the teaching of the present invention in a matrix structure and each having a capacity of 1 Mbits including 1024 bits in the rowwise and columnwise directions, respectively. With respect to the logical configuration, the semiconductor memory is imparted with the image rotating function on the 90° basis as described hereinbefore by reference to FIG. 3.

The dot image buffer shown in FIG. 5 thus has a memory capacity equal to 12 Mbits in total; 4096 (=1024×4) bits and 3072 (=1024×3) bits in the rowwise and columnwise directions, respectively. Such memory capacity will be required for printing on a sheet of A3 size with a line density of the order of 240 dots/inch on the condition that one dot of the printer corresponds to one bit of the memory. In carrying out the data writing operation to this dot image buffer, data writing is first performed to the semiconductor memory M1 32 times on the 32-bit basis at the rotational angle of 0° as described hereinbefore in conjunction with FIG. 3. In succession, the writing operation is similarly performed 32 times for the semiconductor memory M2 at the rotational angle of 0°. After the data having been written in this manner, the data reading operation at the rotational angle, for example, of 90° can be carried out by first reading the data from the semiconductor memory M9 32 times on the 32-bit basis, being followed by the similar reading operation for the semiconductor memory M5. When the data of the memory M1 has been read, return is made to the memory M9 where the data are read on the 32-bit basis at the rotational angle of 90° by incrementing the 90°/270°-column address by one.

In this manner, the data that has undergone rotation by 90° can be read. Thus, there can readily be realized the dot image buffer which can be read out on the 90° basis.

Figure 6A:
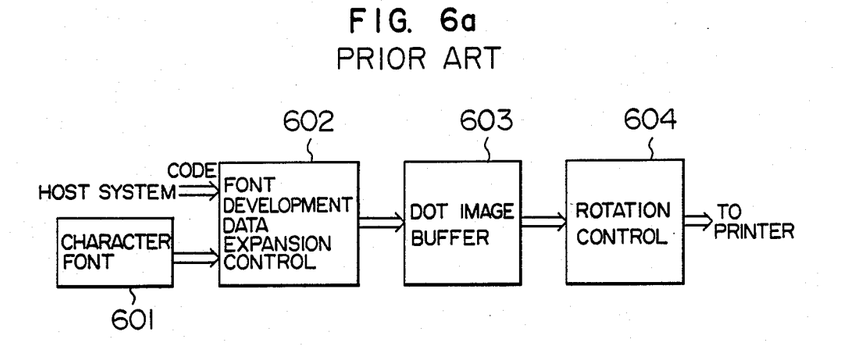
FIGS. 6a and 6b are views for illustrating the arrangement of a printer controller system implemented by using the semiconductor memory according to the invention comparatively with that of the prior art printer controller system.
Figure 6B:
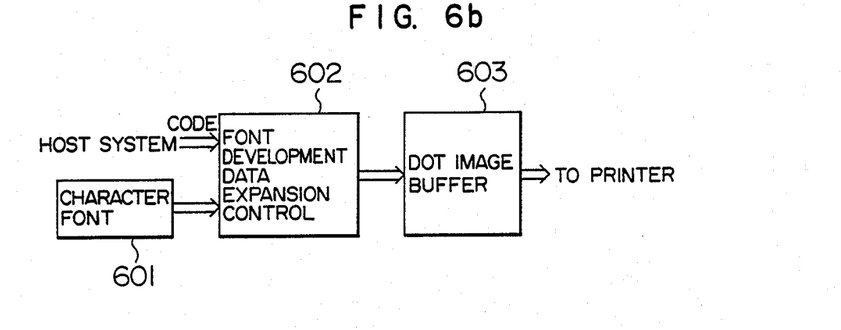

FIGS. 6a and 6b show comparatively printer control systems in which the conventional semiconductor memory and the inventive semiconductor memory are employed, respectively, and which are designated for printing out compressed data with rotation by 90°.

More specifically, FIG. 6a shows the printer control system in which the prior art semiconductor memory is employed. Referring to the figure, compressed data sent from a host system is expanded under the control of a font development/expansion control unit 602 and developed to the dot image data with the aid of a character font generator 601, which data are then sequentially written in a dot image buffer 603. In the case of the printer control system in FIG. 6a, the dot image buffer 603 is not imparted with any rotational function on the 90° basis. Consequently, when data that has undergone rotation of 90° has to be read, the rectangular area of 32×32 bits must first be read out on the 32-bit basis from the dot image buffer 603 to be written in a rotation control unit 604, wherein upon completion of the writing of the rectangular area, the data is rotated by 90° and read out from the rotation control unit 604 on the 32-bit basis.

On the other hand, in the case of the dot image buffer in which the semiconductor memory according to the present invention is used, such complicated processing as mentioned above is not required while the system can be implemented in such a structure in which the rotation control unit 604 of the system shown in FIG. 6a is spared, as will be seen in FIG. 6b. Besides, since the data rotated on a 90-degree basis can be read out directly from the dot image buffer 603, data writing/reading operation for the rotation control unit 604 can be omitted. Consequently, the rotated data can be successively read out, whereby the reading speed can be significantly enhanced.

In the foregoing, the present invention has been described in conjunction with exemplary embodiments. It should however be understood that the invention is not restricted to the disclosed embodiments but various modifications and changes can readily occur to those skilled in the art without departing from the spirit and scope of the invention. For example, in the foregoing description of the exemplary embodiments, it has been assumed that the data as read out has the width of 32-bits. However, the invention is not limited exactly to such data width. Further, it has been described that the data of one row is logically arrayed in the form of one matrix of 32×32 bits. It should however be appreciated that one row of data can also be logically represented by four matrixes each of 16×16 bits. Besides, by providing the matrix shown in FIG. 4 additionally with a data selector for selecting the data in the direction of 45°, rotation of the image data on the 45° basis can also be effectuated. In another modification, an address counter may internally be provided to thereby make unnecessary the external inputting of the address signal. In a further version, a write mask function known per se may be additionally incorporated on the bit basis with the aid of a dual port memory for bit map display also known heretofore, to thereby allow only the given requisite bits to be written in. It should further be added that in the case of the embodiment disclosed herein in which one character is constituted by 32×32 bits, the lateral string of characters may be written in the dot image buffer to be subsequently read out therefrom in the form of a vertical array or string of characters.

As will now be appreciated from the foregoing description, by virtue of the function for dividing the data corresponding to one row of the memory cell array into a plurality of data groups and selecting one data group therefrom and the function for selecting one bit from every one of the data groups simultaneously, rotation of the bit image on the 90° basis can be realized straightforwardly with a conventional semiconductor memory of large capacity. Accordingly, when the semiconductor memory is used as a dot image buffer for the printer, the image data can be read out after rotation on the 90° basis within the dot image buffer itself, whereby external circuits otherwise required for the image rotation control can be spared while assuring profitably and a significantly enhanced rotational reading speed.

We claim:

1. A semiconductor memory, comprising:
   a memory cell array constituted by a plurality of rowwise lines and a plurality of columnwise lines;
   decoder means for selecting one rowwise line of said memory cell array;
   first selecting means connected to said memory cell array for selecting a first group from a plurality of groups into which bits of said selected rowwise line are divided, said first group representing a series of bits arranged in parallel to the rowwise lines;
   second selecting means connected to said memory cell array for selecting one bit at a bit position from every one of said plurality of bit groups to thereby form a second group which represents a series of bits arranged in parallel to the columnwise lines; and
   third selecting means responsive to a rotation signal, for selecting one group from said first and second groups obtained through said first and second selecting means.

2. A semiconductor memory according to claim 1, wherein the number of bits contained in said first group obtained through said first selecting means is equal to the number of bits contained in said second group obtained through said second selecting means.

3. A semiconductor memory according to claim 1, wherein when the bits of said selected one rowwise line are to be represented in the form of a matrix array, said first group obtained through said first selecting means corresponds to one row of said matrix array while said second group obtained through said second selecting means corresponds to one column of said matrix array.

4. A semiconductor memory according to claim 1, wherein said first, second and third selecting means are bidirectional.

5. A semiconductor memory according to claim 1, wherein said decoder means has an input supplied with an address signal.

6. A semiconductor memory according to claim 1, wherein said decoder means includes counter means.

7. A semiconductor memory, comprising:
   a memory cell array constituted by a plurality of rowwise lines and a plurality of columnwise lines;
   first polarity control means for selectively inverting a part of an input address signal;
   first decoder means connected to said first polarity control means for selecting one rowwise line of said memory cell array;
   first selecting means connected to said memory cell array for selecting one group from a plurality of groups into which the bits of said selected one rowwise line are divided;
   second selecting means connected to said memory cell array for selecting one bit from every one of said plurality of groups for thereby forming one group;
   second decoder means responding to said remaining part of said input address signal to designate two groups obtained through each of said first and second selecting means;
   third selecting means for selecting one of the two groups obtained through said first and second selecting means;
   sequence control means connected to said third selecting means for controlling the bit sequence direction of said one group selected by said third selecting means; and
   mode selecting means connected to said first polarity control means, said third selecting means and said sequence control means for controlling these means to rotate the written bits on the 90° basis.

8. A semiconductor memory according to claim 7, further comprising second polarity control means connected to said second decoder means and said mode selecting means for responding to the control by said mode selecting means thereby to invert or not to invert said remaining part of said input address signal.

9. A semiconductor memory according to claim 7, wherein said first, second and third selecting means and said sequence control means are bidirectional.

10. A semiconductor memory according to claim 7, further comprising fourth selecting means connected to said first plurality control means and said mode selecting means for responding to the control of said mode selecting means to thereby supply a most significant address part and a least significant address part of said input address signal to a most significant address portion and a least significant address portion or vice versa, respectively, of said first decoder means, wherein a median significance address part is supplied to said second polarity control means.

11. A semiconductor memory according to claim 10, wherein said first, second and third selecting means and said sequence control means are bidirectional.

* * * * *